United States Patent
Alameh (10) Patent No.: US 11,121,276 B2
(45) Date of Patent: Sep. 14, 2021

(54) PANEL STRUCTURE FOR RECEIVING LIGHT AND GENERATING ELECTRICITY

(71) Applicant: TROPIGLAS TECHNOLOGIES LTD, Yokine (AU)

(72) Inventor: Kamal Alameh, Joondalup (AU)

(73) Assignee: TROPIGLAS TECHNOLOGIES LTD., Yokine (AU)

(*) Notice: Subject to any disclaimer, the term of this patent is extended or adjusted under 35 U.S.C. 154(b) by 0 days.

(21) Appl. No.: 15/772,242

(22) PCT Filed: Oct. 28, 2016

(86) PCT No.: PCT/AU2016/051021
§ 371 (c)(1),
(2) Date: Apr. 30, 2018

(87) PCT Pub. No.: WO2017/070745
PCT Pub. Date: May 4, 2017

(65) Prior Publication Data
US 2018/0323327 A1    Nov. 8, 2018

(30) Foreign Application Priority Data

Oct. 30, 2015  (AU) ............................. 2015904462
Mar. 9, 2016   (AU) ............................. 2016900884

(51) Int. Cl.
*H02N 6/00*     (2006.01)
*H01L 31/042*   (2014.01)
(Continued)

(52) U.S. Cl.
CPC ............ *H01L 31/0543* (2014.12); *E06B 9/24* (2013.01); *H01L 31/02366* (2013.01);
(Continued)

(58) Field of Classification Search
CPC ..... H02S 40/22; H02S 20/26; H01L 31/0468; E06B 9/24
(Continued)

(56) References Cited

U.S. PATENT DOCUMENTS 4,536,608 A    8/1985  Sheng et al.
7,998,877 B1   8/2011  Chadda
(Continued)

FOREIGN PATENT DOCUMENTS

| CN | 201829508 U | 5/2011 |
|---|---|---|
| JP | 2013038323 A | 2/2013 |
| WO | 2015/024045 A1 | 2/2015 |

OTHER PUBLICATIONS

Xing Sheng et al: "Low-cost, Deterministic Quasi-periodic Photonic Structures for light trapping in thin film silicon solar cells", Photovoltaic Specialists Conference (PVSC), 2009 34th IEEE, IEEE, Piscataway, NJ, USA, Jun. 7, 2009, pp. 2395-2398, XP031626587, ISBN: 978-1-4244-2949-3.
(Continued)

*Primary Examiner* — Angelo Trivisonno
(74) *Attorney, Agent, or Firm* — Carlson, Gaskey & Olds (57) ABSTRACT

The present disclosure provides a panel structure for receiving light and generating electricity. The panel structure comprises a panel material that has a light receiving surface. The panel material is at least partially transmissive for light having a wavelength in the visible wavelength range. The panel structure further comprises a photovoltaic material being positioned in or at the panel material. The photovoltaic material is distributed between transmissive areas that are void of the photovoltaic material such that features of the photovoltaic material are sufficiently narrow to be at least largely invisible to the naked eye.

14 Claims, 7 Drawing Sheets

(51) Int. Cl.
*H01L 31/054* (2014.01)
*E06B 9/24* (2006.01)
*H01L 31/0236* (2006.01)
*H01L 31/048* (2014.01)
*H02S 40/22* (2014.01)
*H01L 31/046* (2014.01)
*H01L 31/0468* (2014.01)
*H01L 31/0749* (2012.01)

(52) U.S. Cl.
CPC ........ *H01L 31/046* (2014.12); *H01L 31/0468* (2014.12); *H01L 31/0488* (2013.01); *H01L 31/0749* (2013.01); *H02S 40/22* (2014.12); *E06B 2009/2476* (2013.01); *Y02E 10/52* (2013.01)

(58) Field of Classification Search
USPC .................................................. 136/246, 257
See application file for complete search history.

(56) References Cited

U.S. PATENT DOCUMENTS 9,553,219 B2 † 1/2017 Mei

| | | | |
|---|---|---|---|
| 2002/0157700 A1* | 10/2002 | Ito | G04C 10/02 |
| | | | 136/244 |
| 2011/0203633 A1 | 8/2011 | Prather et al. | |
| 2011/0203663 A1 | 8/2011 | Prather et al. | |
| 2011/0265841 A1 | 11/2011 | Lee et al. | |
| 2013/0213472 A1* | 8/2013 | Powell | H01L 31/0392 |
| | | | 136/257 |
| 2013/0333693 A1* | 12/2013 | Hashimura | G02B 5/208 |
| | | | 126/714 |
| 2014/0251412 A1* | 9/2014 | Martins | H01L 31/02327 |
| | | | 136/246 |

OTHER PUBLICATIONS

Extended European Search Report for Application No. EP 16 85 8509 dated May 8, 2019.
Written Opinion and International Search Report for International application No. PCT/AU2016/051021 dated Jan. 20, 2017.
Transmittal of International Preliminary Report on Patentability for International application No. PCT/AU2016/051021 dated Feb. 20, 2018.

\* cited by examiner
† cited by third party

PANEL STRUCTURE FOR RECEIVING LIGHT AND GENERATING ELECTRICITY

FIELD OF THE INVENTION

The present invention relates to a panel structure for receiving light and generating electricity and relates particularly, though not exclusively, to a panel structure for use as a window pane.

BACKGROUND OF THE INVENTION

Overheating of interior spaces, such as spaces that receive sunlight through large windows, is a problem that may be overcome using air conditioners. A large amount of energy is globally used to cool interior spaces. The majority of electrical energy is generated using non-sustainable sources, which is of increasing environmental concern.

PCT international applications numbers PCT/AU2012/000778, PCT/AU2012/000787 and PCT/AU2014/000814 (owned by the present applicant) disclose a spectrally selective panel that may be used as a windowpane and that is largely transmissive for visible light, but diverts a portion of incident light to side portions of the panel where it is absorbed by photovoltaic elements to generate electricity.

The present invention provides further improvements.

SUMMARY OF THE INVENTION

In a first aspect of the present invention there is provided a panel structure for receiving light and generating electricity, the panel structure comprising:

a panel material having a light receiving surface, the panel material being at least partially transmissive for light having a wavelength in the visible wavelength range; and a photovoltaic material being positioned in, at, or in the proximity of the panel material, the photovoltaic material being distributed between transmissive areas that are void of the photovoltaic material such that features of the photovoltaic material are sufficiently narrow to be at least largely invisible to the naked eye.

The panel structure in accordance with embodiments of the present invention provides the advantage that the panel structure can for example function as a window pane and generate electricity while there is no or only minimal obstruction of a view through the panel structure. Further, dependent on the percentage of the surface area of the photovoltaic material compared to the receiving surface of the panel structure, a relatively large portion of the total area of the panel structure can be used for generating electricity even though the panel appears to be at least largely transparent to the naked eye.

Features of the photovoltaic material may have a diameter of 100 to 80, 80 to 60, 60 to 40, 40 to 20 or 20 to 10 micrometres. Transmissive areas between these features may have a diameter of 100 to 80, 80 to 60, 60 to 40, 40 to 20 or 20 to 10 micrometres.

The photovoltaic material may form a pattern. Further, the photovoltaic material may form a diffractive element that is arranged to absorb a portion of received light to generate electricity and deflect a portion of the received light towards at least one edge surface of the panel material. The diffractive element may comprise a periodic or quasi-periodic arrangement of the photovoltaic material.

Throughout this specification the term "quasiperiodic arrangement" is used for an arrangement that includes a periodic component and also a non-periodic component that may be randomly distributed.

The diffractive element may be a diffractive grating having a period of 200 micrometres or less, such as less than 150, 100, 80, 60 or 40 micrometres. If the diffractive grating comprises a periodic arrangement, the diffractive element may comprise regularly formed and repetitive features. If in contrast the diffractive element comprises a quasiperiodic arrangement, the diffractive element may comprise irregularly formed features or regularly formed features at random orientations and adjacent features are distributed at positions that define a period of the quasiperiodic arrangement.

The diffractive element may be arranged such that predominantly light having a wavelength in an infrared wavelength range is deflected towards the at least one edge surface. The diffractive element and the panel material may be arranged such that at least a portion of the deflected light is guided within a panel material towards the at least one edge surface. The panel structure may comprise further photovoltaic material that is positioned at the at least one edge surface of the panel material to receive at least a portion of the deflected light, such that additional electricity can be generated. The deflection of infrared radiation by the diffractive element has the further advantage that transmission of infrared radiation into buildings (when the panel is used as a window pane) can be reduced, which consequently reduces overheating of spaces within the building and can reduce costs for air conditioning and the like.

The photovoltaic material may be provided in any suitable form and may comprise any suitable materials. In one specific embodiment of the present invention the photovoltaic material is provided in the form of a thin film material and may comprise, or may be composed of, CIS (Copper Indium Diselenide) or CIGS (Copper Indium Gallium Diselenide).

The photovoltaic material of the diffractive element may form a periodic or quasiperiodic arrangement that determines a period of the diffractive element.

The photovoltaic material may be provided in the form of a continuous material or may comprise interconnected material portions arranged so that the diffractive element has either a periodic or a quasi-periodic structure. For example, the diffractive element may comprise lines or randomly shaped or oriented photovoltaic material or a pattern having at least largely transmissive materials between the photovoltaic material and that determine the period of the diffractive element. The transmissive material areas may or may not have regular shapes.

The transmissive material areas may have any suitable shape (such as any polygonal shape or an irregular shape) and the diffractive element may comprise any number of transmissive material areas with different shapes, as long as the transmissive material areas are positioned so that the diffractive element as a whole defines an arrangement that has an average period. Further, the diffractive element may have more than one period. For example, the diffractive element may comprise transmissive material areas of different sizes that are distributed to define different periods.

In one specific embodiment, the photovoltaic material forms a pattern in a plane and comprises features that extend across at least a portion (such as the majority) of the panel material. The features of the photovoltaic material may occupy 1%-5%, 5%-20%, 20%-40%, 40%-600, or 60-80% or more of an area (in a plane that is typically parallel to the receiving surface of the panel) of the diffractive element.

The photovoltaic material may be provided in the form of a material that is positioned on, or may be formed on, the panel material. For example, the photovoltaic material may be provided in the form of a layered structure thin film material formed on the panel material, which may for example be formed from glass or an organic material.

In one embodiment the photovoltaic material is provided in the form of a continuous layered structure thin film material on the panel material and transmissive material areas are then formed for example using laser ablation or a suitable etching process.

In one specific embodiment the diffractive element is a diffractive grating that has a cross sectional profile with teeth and recesses (formed by grooves). The photovoltaic material may be positioned in the recesses or on the teeth.

In addition, the panel material may also comprise a luminescent material that is arranged to absorb at least a portion of incident and/or reflected light and emit light by luminescence, which facilitates directing of incident light towards the at least one edge portion of the panel material.

The panel material may comprise at least two spaced apart panel portions that are positioned substantially parallel to each other. The diffractive element and the luminescent material may be positioned between two panel portions that may be glued together using a suitable optical adhesive.

In one embodiment the panel material also comprises an optical interference coating that is arranged to reflect incident light within an infrared (IR) wavelength band and/or within an ultraviolet (UV) wavelength band while being largely transmissive for at least the majority of light having a wavelength within the visible wavelength band. The optical interference coating may be positioned such that in use incident light penetrates through the above-mentioned spaced apart panel portions before reaching the optical interference coating.

In a second aspect of the present invention there is provided a panel structure for receiving light and generating electricity, the panel structure comprising:

a panel material having a light receiving surface and at least one edge surface, the panel material being at least partially transmissive for light having a wavelength in the visible wavelength range;

a diffractive element being positioned in, at or in the proximity of the panel material, the diffractive element comprising a periodic or quasi-periodic arrangement of a photovoltaic material that is arranged to absorb a portion of the received light to generate electricity and the diffractive element being arranged to deflect a portion of the received light towards the at least one edge surface of the panel material.

Features of the diffractive element may be sufficiently narrow such that they are invisible to the naked eye. A person skilled in the art will appreciate that alternatively the features of the diffractive element may be slightly larger in size. For example, the features of the diffractive element may have a diameter of 150 micrometres to 100 micrometres or 100 micrometres to 75 micrometres. In this case, features of the diffractive element may be visible to the naked eye by close inspection, but are sufficiently narrow such that they do not significantly obstruct the view through the panel structure when used as a window pane.

In a third aspect of the present invention there is provided a method of fabricating a panel structure for receiving light and generating electricity, the method comprising the steps of:

providing a panel that is at least partially transmissive for visible light, the panel having a major surface with grooves or recesses that define a periodic or quasiperiodic structure such that the major surface has upper and lower surface portions, growing CIS or CIGS material on the major surface; and
removing the CIS or CIGS material from the upper surface portions.

The step of providing the panel may comprise forming the panel structure. For example, the panel may be formed form glass or a polymeric material and forming the panel may comprise rolling the glass or the polymeric material between rollers and at least one of the rollers may have a profiled surface such that the groves or recesses are embossed when the glass of polymeric material is rolled between the rollers.

The step of removing the CIS or CIGS material from the upper surface portion may comprise polishing the major surface of the panel to remove the CIS or CIGS material from the upper surface portions.

The panel structure may be the panel structure in accordance with the first or second aspect of the present invention.

The invention will be more fully understood from the following description of specific embodiments of the invention. The description is provided with reference to the accompanying drawings.

DETAILED DESCRIPTION OF SPECIFIC EMBODIMENTS

Embodiments of the present invention generally relate to a panel structure that may for example be used as a window pane. The panel structure has a panel material that may form a pattern. The photovoltaic has features that are sufficiently small such that the pattern is at least largely or even entirely invisible to the naked eye.

The photovoltaic material forms in one embodiment a diffractive grating. The diffractive grating may form a portion of the panel material or may be positioned on or in the proximity of the panel material. The diffractive grating is formed from a periodic or quasiperiodic arrangement of a photovoltaic material and is arranged to absorb a portion of the received light to generate electricity and deflect a portion of the received light towards an edge surface of the panel material.

The photovoltaic material is in one embodiment provided in the form of a CIS or CIGS thin film material, but a person skilled in the art will appreciate that alternatively the photovoltaic material may be provided in other formes (including any suitable conventional inorganic photovoltaic material and organic material, such as polymeric photovoltaic materials). For example, the photovoltaic material may initially be deposited or positioned on a largely transparent pane and a pattern of transmissive materials (lines or any other regular or irregular shapes) may be formed within the photovoltaic material using laser ablation or suitable etching techniques. The panel structure consequently has the advantage that the photovoltaic material is largely invisible and consequently appears transparent, but collects sunlight for generation of electricity.

Figure 1:
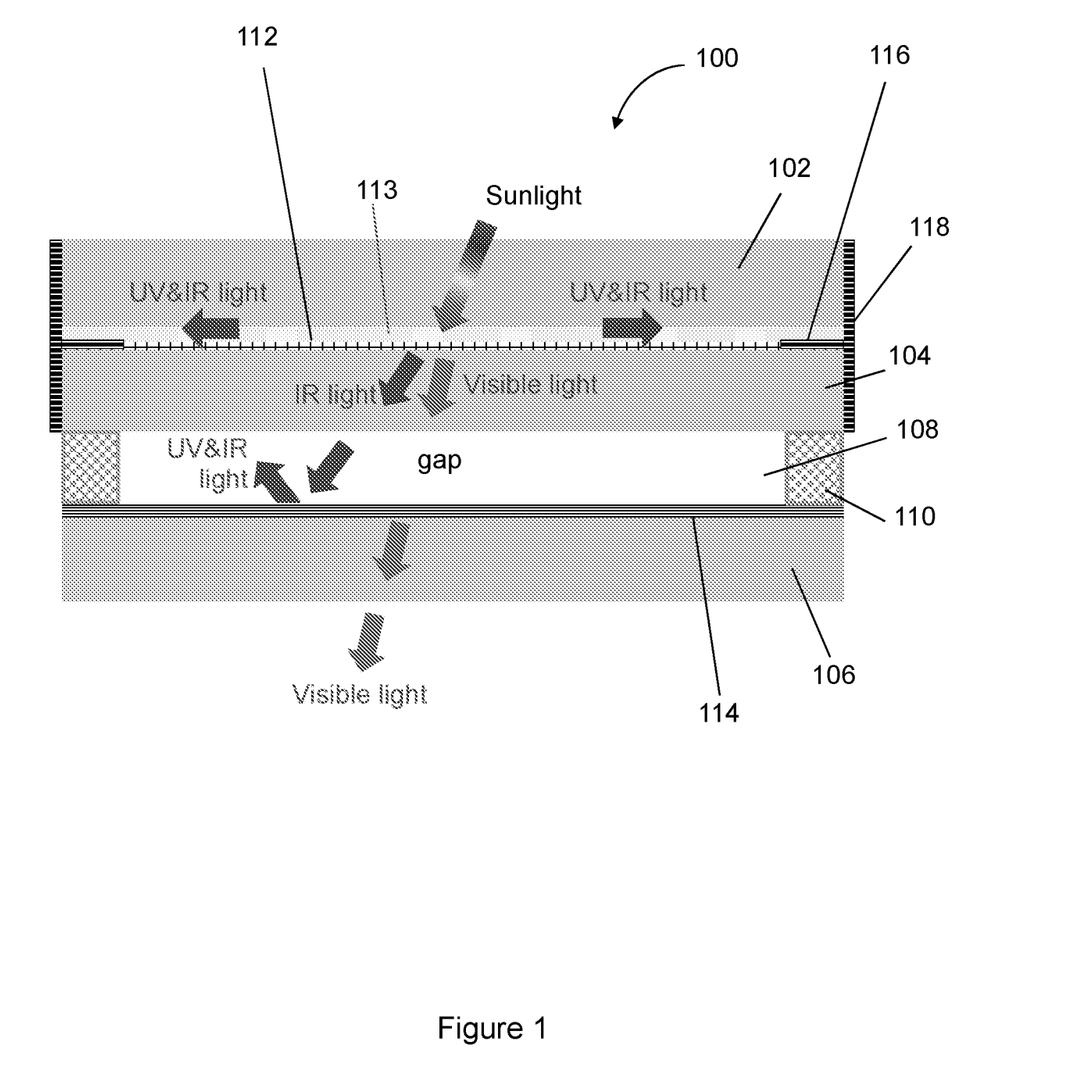
FIG. 1 is a schematic cross-sectional representation of a panel structure in accordance with an embodiment of the present invention.

Referring initially to FIG. 1, a schematic cross sectional representation of a panel structure 100 for receiving light and generating electricity is now described. The panel structure 100 is in this embodiment provided in the form of a pane for a window. However, a person skilled in the art will appreciate that the panel structure 100 has other applications. The panel structure 100 comprises a first panel portion 102, a second panel portion 104 and third panel portion 106. In this embodiment the first, second and third panel portions 102, 104 and 106, respectively, are provided in the form of glass panes. It will be appreciated, however, that alternatively the panes may be formed from a polymeric material.

The panel portions 104 and 106 are spaced apart by spacers 110, such that a gap 108 is formed between the panel portions 104 and 106. A diffractive grating 112 is positioned between the panel portions 102 and 104. The diffractive grating 112 comprises a photovoltaic material that is provided in form of a pattern. In this embodiment, the pattern comprises lines that extend across the majority of the panel portion 104 on which the grating structure 112 is formed. The photovoltaic material is provided in the form of a periodic structure comprising the photovoltaic material and transmissive materials. The transmissive materials are formed such that the photovoltaic material comprises features that are sufficiently small such that they are invisible to the naked eye. Typically, the photovoltaic material comprises lines or other structures that have a width that is narrower than 100 to 50 micrometres, such as 10-25 micrometres.

A person skilled in the art will appreciate that in a variation of the above-described embodiment the diffractive grating may not be positioned between the panel portions 102 and 104, but may alternatively be positioned over the panel portions 102 or under the panel portion 106.

Figure 2:
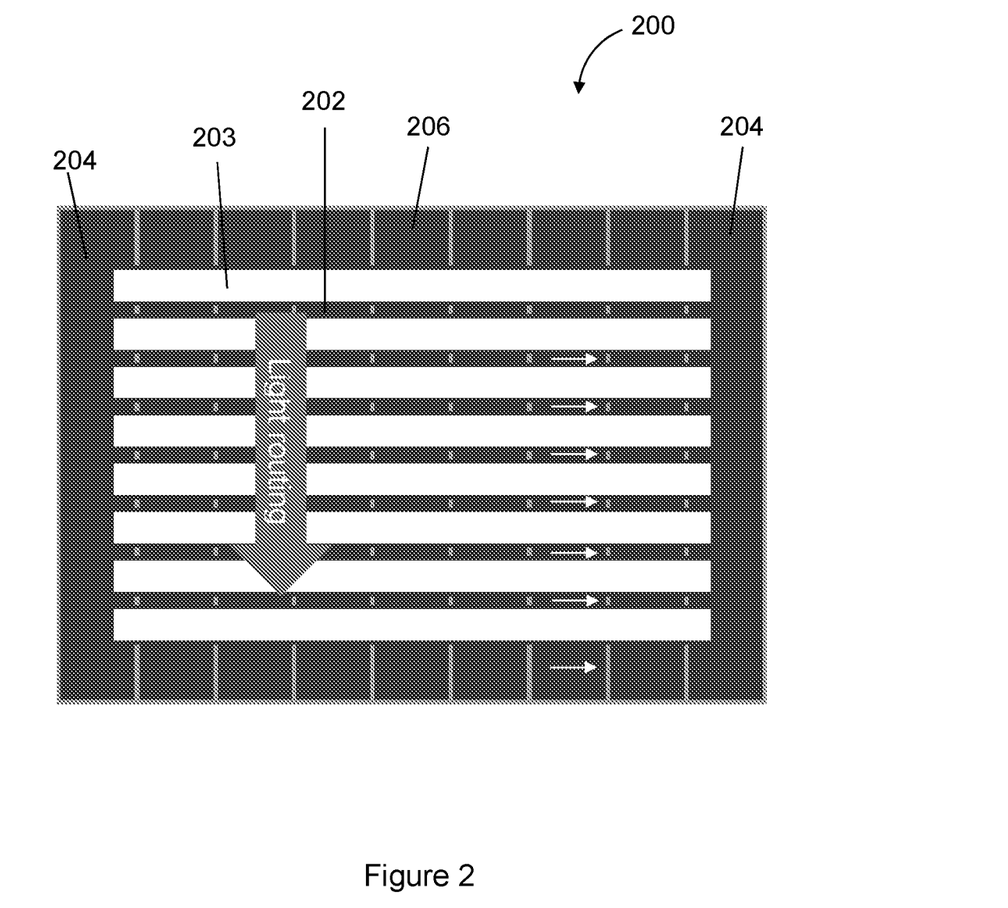
FIG. 2 is a schematic cross-sectional representation of a component of the panel structure in accordance with an embodiment of the present invention.
Figure 3:
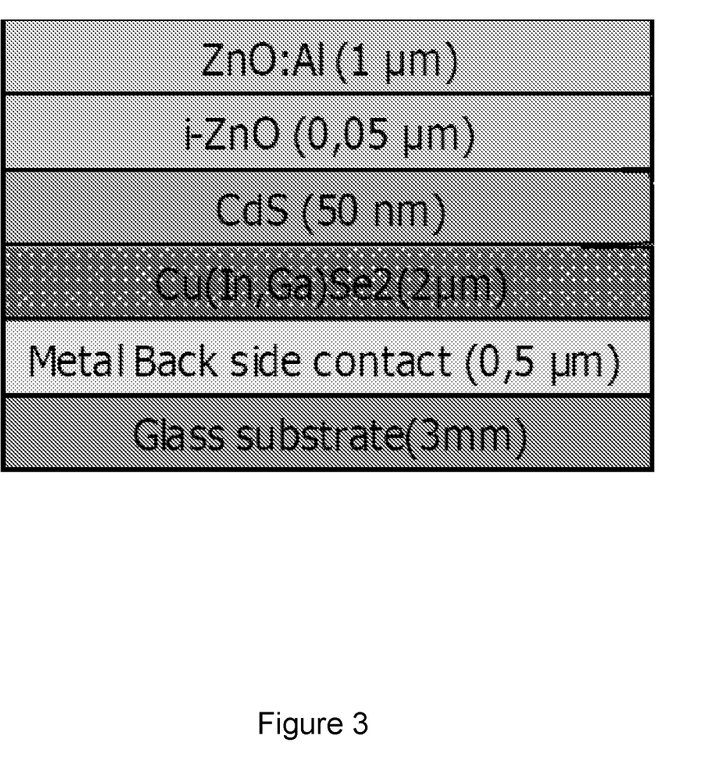
FIG. 3 is a schematic representation of a CIGS layered structure.

FIG. 2 shows schematically a top view of a diffractive grating 200, which is identical to the diffractive element 112 shown in FIG. 1. In this embodiment, the diffractive grating 200 comprises lines 202 that have a width of 10 to 25 micrometres. Transmissive material portions 203 between the lines 202 have a width of approximately 40 to 75 micrometres. The lines 202 and the transmissive material portions 203 may for example have a length of 1000 millimetres. In this embodiment the photovoltaic material of the diffractive grating 200 is provided in the form of a thin film layered structured material, which in this embodiment is CIS or CIGS, but could be Cadmium Telluride (CdTe) or amorphous silicon (a-Si). FIG. 3 illustrates schematically the layered structure of a CIGS photovoltaic material.

The lines of the diffractive grating 200 comprise CIGS photovoltaic cells that are series connected. The diffractive grating 200 further comprises photovoltaic material 206 (which includes a series of CIGS photovoltaic cells) positioned at edge portions and oriented parallel to a light receiving surface of the window pane. Further, the diffractive grating 200 comprises photovoltaic material 204 and the photovoltaic material 202, 204 and 206 is connected such that a voltage is generated between two opposite photovoltaic materials 204.

Returning to FIG. 1, further features of the panel structure 100 are now described. The diffractive grating 112 has a period that is selected such that the diffractive grating 112 predominantly deflects light having a wavelength range in the infrared wavelength range. At least a portion of deflected infrared light is then routed within the panel portions 102 and 104 towards edge portions of the panel portion 104, where it is collected by additional photovoltaic elements 118 and can consequently be used for generating electricity. Further, the panel structure 100 comprises additional photovoltaic elements 116 positioned along edge portions of the panel portion 104 and oriented parallel to a light receiving surface of the panel structure 100. The photovoltaic elements 116 shown in FIG. 1 correspond to the photovoltaic elements 204 and 206 shown in FIG. 2. The photovoltaic elements 116 collect further light that is deflected by the diffractive grating 112 towards edge portions of the panel portion 104 and also collect direct sunlight.

The panel portions 102 and 104 are glued together using a suitable optical adhesive such that the diffractive grating 112 is sandwiched between the panel portions 102 and 104.

The panel structure 100 further comprises a multilayer film structure 114 which is arranged to reflect at least a portion of incoming UV and IR light and is largely transmissive for visible light. The multilayer film structure 114 is positioned at a top surface of the panel portion 106 and facilitates directing of light towards edges of the panel portion 104 as well as 102.

Further, the panel structure 100 comprises a luminescent and/or light scattering material 113 that in this embodiment is also sandwiched between the panel portions 104 and 106. The luminescent and/or scattering material 113 also facilitates redirecting of incoming IR and UV light towards edges of the panel portions 102 and 104 where is collected by photovoltaic elements 112.

The transmissive materials 203 of the diffractive grating 112 are in this embodiment filled with an adhesive material that includes the luminescent material 113. In this particular example adhesive material comprises a luminescent scattering powder comprising an epoxy. The scattering of incident light by the luminescent scattering powder increases a portion of the light that is directed towards edge portions of the panel material 100.

Further details of the luminescent and/or scattering material 113 and the multilayer film 114 structure are described in PCT international applications numbers PCT/AU2012/000778 and PCT/AU2012/000787 (owned by the present applicant and which are herewith incorporated by cross-reference.

The panel structure 100 consequently generates electricity by absorbing incoming light at the photovoltaic material of the grating structure 112 and deflects light towards edges of the panel 104 where the deflected light is collected by the photovoltaic elements 118 and 116 for generating additional electricity.

Figure 4:
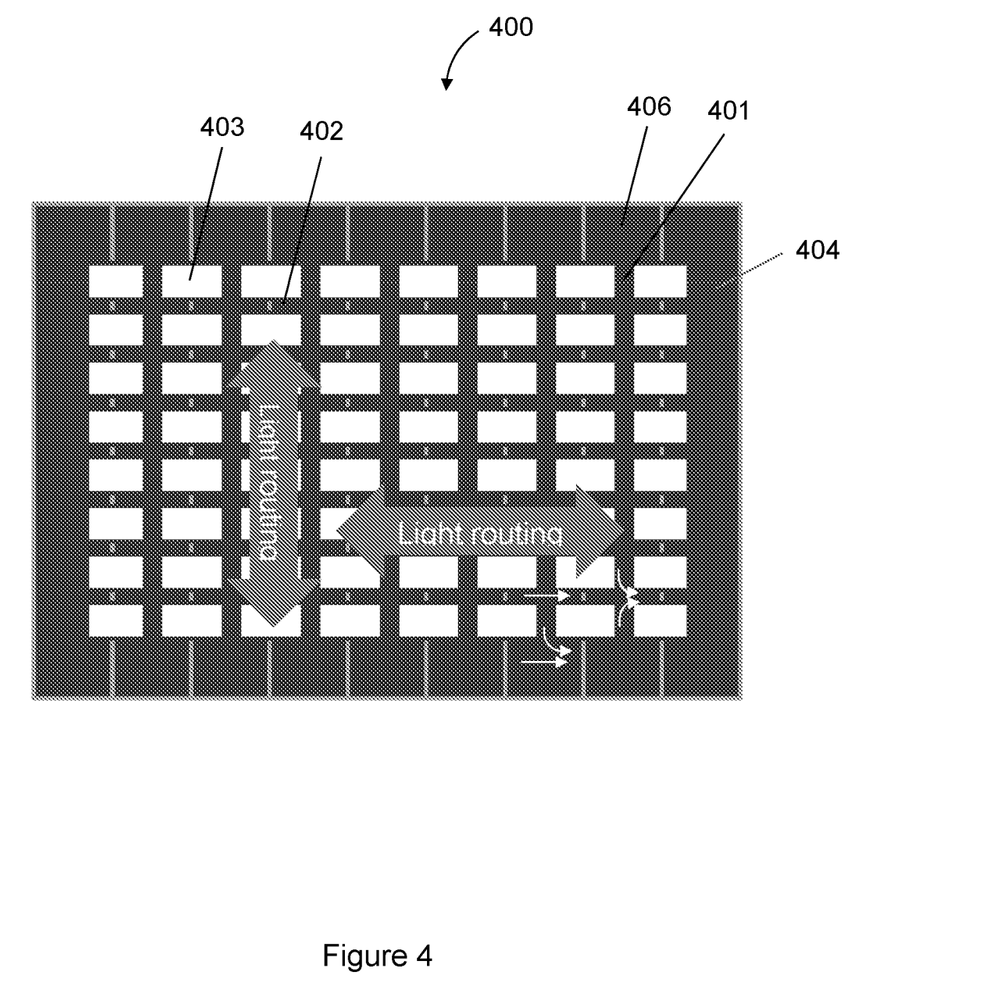
FIGS. 4-6 are schematic representations of components of the panel structure in accordance with embodiments of the present invention.
Figure 5:
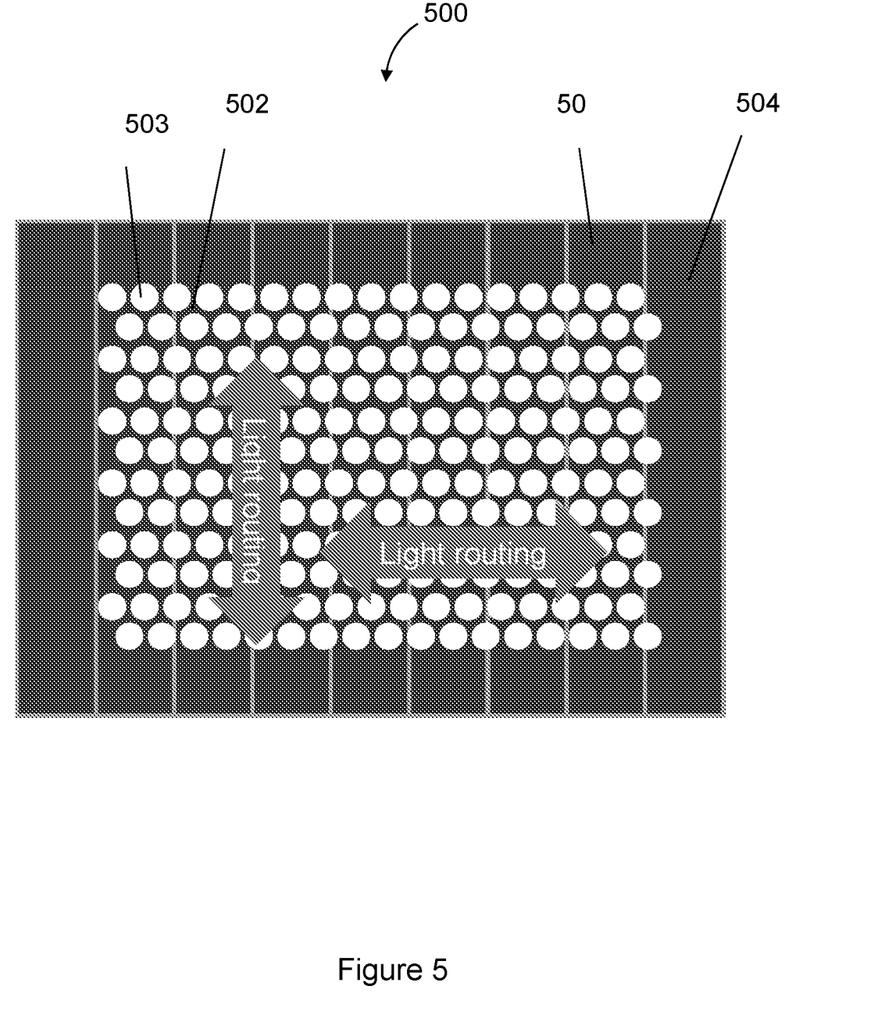
Figure 6:
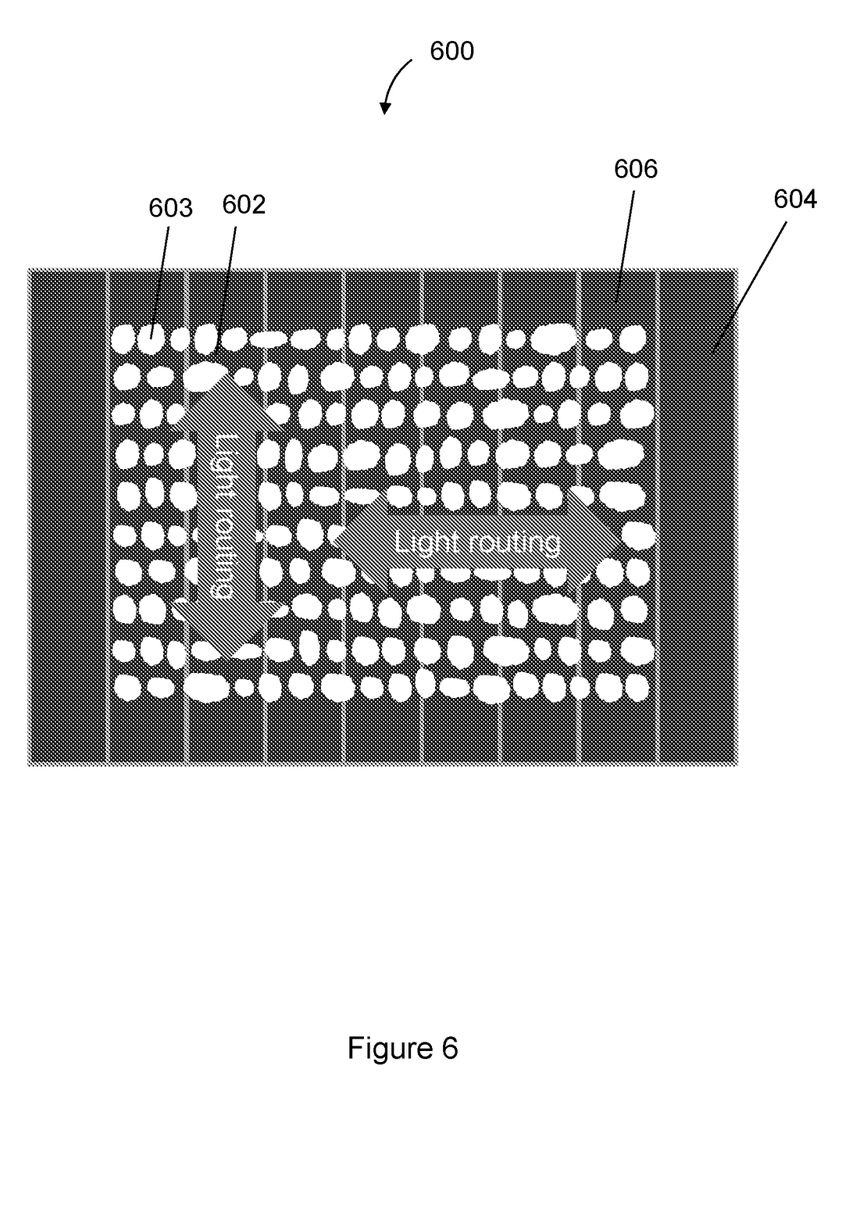

Referring now to FIGS. 4 to 6, further diffractive gratings 400, 500 and 600 in accordance with embodiments of the present invention are now described. The diffractive grating 400, 500 and 600 may replace the diffractive grating 112 shown in FIG. 1. The diffractive grating 400 comprises lines 401 and 402 that are positioned such that rectangular transmissive material areas 403 are formed. In this embodiment, the lines 401 and 402 are sufficiently narrow such that are invisible to the naked eye. For example, the lines 401, 402 may have a width of less than 50 micrometres, such as 10-25 micrometres. In this embodiment the grating period and the lines 401, 402 are positioned such that a portion of incoming light is absorbed by the photovoltaic material of the lines 401 and 402 and a further portion of the incoming light is directed or routed towards edges of the panel to which in use the diffractive grating 400 is applied. The grating structure 400 also comprises photovoltaic material 404 and 406 at edges and oriented in the plane of the diffractive grating 400.

FIGS. 5 and 6 show variations of the above described diffractive grating. The diffractive grating 500 is again formed from CIS or CIGS. Substantially circular transmissive material areas 503 are formed through the CIS or CIGS material such that a periodic pattern is formed. In this embodiment, remaining CIS or CIGS material between the transmissive material areas 503 is sufficiently narrow such that it is invisible to the naked eye. The circular transmissive material areas 503 have in this embodiment a diameter of 30 to 75 micrometres and remaining CIS or CIGS material 502 has a diameter of the order of 10 to 25 micrometres. The grating structure 500 also comprises photovoltaic material 504 and 506 at edges and oriented in the plane of the diffractive grating 500.

FIG. 6 shows a diffractive grating in accordance with another embodiment of the present invention. The diffractive grating 600 is related to the diffractive grating 500, but in this case the transmissive material areas 603 that have irregular shapes and sizes. However, the transmissive material areas 603 form a periodic structure. The transmissive material areas 603 have in this example a diameter of approximately 30 to 70 micrometres and remaining CIS or CIGS material 602 between the transmissive material areas 603 has a diameter of the order of 10 to 25 micrometres. Again, the diffractive grating 600 comprises features that are not visible to the naked eye. The grating structure 600 also comprises photovoltaic material 604 and 606 at edges and oriented in the plane of the diffractive grating 600.

It will be appreciated, however, that in variations of the described embodiments, the diffractive elements 112, 200, 400, 500 and 600 may alternatively comprise slightly larger features that may be visible to the naked eye. For example, the diffractive elements may alternatively have features between transmissive material areas that have a diameter of 100-200 micrometres. In this case the features may be sized such that they may be visible to the naked eye if closely inspected, but are sufficiently small such that they do not obstruct a view through the panel structure in a significant manner.

Further, a person skilled in the art will appreciate that in variations of the described embodiments the photovoltaic material may not for a diffractive element, but may be randomly arranged and may or may not form a pattern.

As described above, the diffractive gratings 112, 200, 400, 500 and 600 in accordance with one embodiment are formed from a CIS or CIGS. Formation of the diffractive gratings may initially comprise providing transparent panes (glass panes), on which the CIS or CIGS is formed. Features of the diffractive gratings may be then formed by ablating portions of the CIS or CIGS material to form the above described transmissive material areas of the diffractive gratings. For example, ablation may comprise photothermal ablation using one or more lasers. Formation of structures having a diameter of less than 20 micrometres is possible using laser ablation. Specifically, a UV wavelength laser of sufficient power is used to ablate locally the CIS or CIGS material, which breaks chemical bonds between molecules and residues are ablated from the surface leaving a transmissive material area (hole). A person skilled in the art will appreciate that in this manner extending structures may be formed by moving the diffractive grating relative to the laser beam. Further, a series of lasers may be used for parallel ablation processes, which reduces production time.

Alternatively, the diffractive grating may be formed using reactive ion etching (RIE), such as deep RIE. In this case, initially CIS or CIGS solar cells are formed on a transparent panel portion, which is then covered by a suitable mask. The panel portion with the CIS or CIGS material and the mask is then placed in a chamber into which suitable gases are introduced for plasma etching using a radio frequency power source.

Wet etching may also be used to form the transmissive material areas in the diffractive gratings. The formed CIS or CIGS material on a transparent pane is covered using a suitable mask that is largely resistant to a selected wet etching process. Etching below areas covered by the mask, which is a known problem for wet etching in particular when forming small structures, can be reduced by using suitable spray etching techniques.

Alternatively, wet etching may also be performed without the mask and using a technique similar to that of ink jet printing in which small droplets of the etching material are positioned directly onto the CIS or CIGS material to form the transmissive material areas.

Further, the CIS or CIGS may be deposited directly onto a transparent pane and in the form of the diffractive grating. In this case the transparent pane is covered by a suitable mask having solid material at areas that correspond to the transmissive material areas. Series of CIS or CIGS photovoltaic cells are then deposited in a conventional manner onto the transparent pane and the mask. The mask is then removed revealing the transmissive material areas. Individual CIS or CIGS photovoltaic cells are then electrically connected using thin molybdenum wires that may have a length of 100 micrometres and a thickness of 25 micrometres and are consequently invisible to the naked eye.

Figure 7:
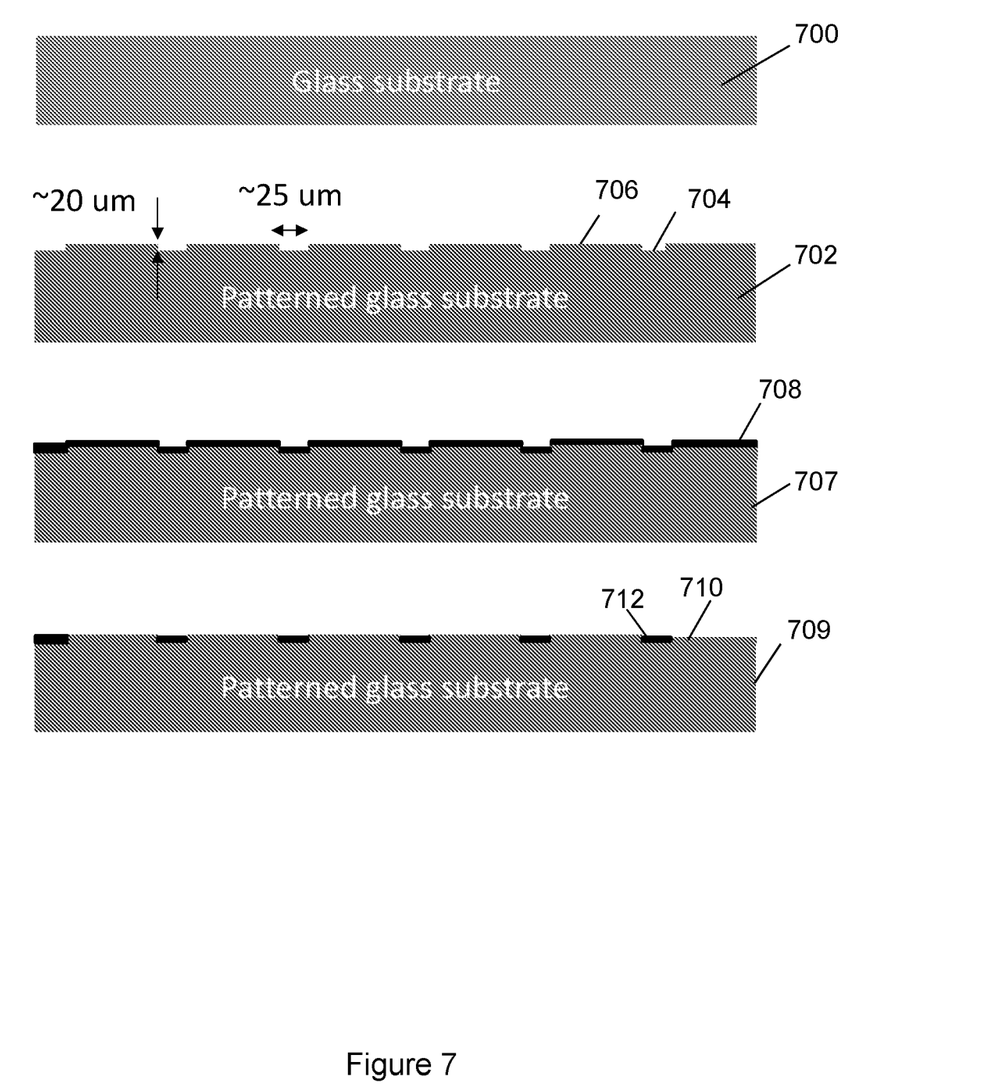
FIG. 7 illustrates a method of fabricating a panel structure in accordance with an embodiment of the present invention.

Turning now to FIG. 7, a method of forming a panel structure in accordance with an embodiment of the present invention is now described. The method comprises the initial step of providing a glass substrate 700. The glass substrate is transmissive for visible light and a person skilled in the art will appreciate that alternatively also a panel formed from a suitable polymeric material may be used. The softened glass panel is then rolled to form grooves or recesses 704 between islands 706 and form a patterned glass substrate 702. The grooves or recesses 704 have a width of approximately 25 µm and a depth of approximately 20 µm. The glass substrate is rolled between two rollers and one roller has projections that correspond to the grooves or recesses 704.

A layer of CIS or CIGS material 708 is then formed on the patterned surface of the glass substrate 702 to form a coated patterned glass substrate 707. The CIS or CIGS material 708 may have a thickness of the order of 3 µm.

The CIS or CIGS material 708 is then polished away from the islands 706 using a conventional polishing process that may remove the uppermost 3 µm of the islands 706 to form the panel structure. A person skilled in the art will appreciate that the grooves or recesses 704 are interconnected such that the formed CIS or CIGS material in the grooves or recesses is electrically interconnected.

A person skilled in the art will appreciate that there are various other methods that may be used to form the structures of the above discussed diffraction gratings.

The reference that is being made to PCT international applications numbers PCT/AU2012/000778, PCT/AU2012/000787 and PCT/AU2014/000814 does not constitute an admission that these documents are part of the common general knowledge in Australia or any other country.

The invention claimed is:

1. A panel structure for receiving light and generating electricity, the panel structure comprising:
   a panel material having a light receiving surface and at least one edge surface, the panel material being at least partially transmissive for light having a wavelength in the visible wavelength range;
   a first photovoltaic material positioned on the panel material and parallel to the light receiving surface, the first photovoltaic material being distributed between transmissive areas of the panel that are void of the first photovoltaic material, wherein features of the first photovoltaic material form a diffractive element that is arranged to absorb a portion of received light to generate electricity and deflect a portion of the received light towards the at least one edge surface of the panel material, wherein the features of the first photovoltaic material have a diameter in a range of 100 to 10 micrometers; and
   a second photovoltaic material positioned at the at least one edge surface of the panel material, the second photovoltaic material being separate from the first photovoltaic material and being perpendicular to the first photovoltaic material, the second photovoltaic material being positioned to receive at least a portion of the deflected light.

2. The panel structure of claim 1 wherein the features of the first photovoltaic material have a diameter of 100 to 80 micrometres.

3. The panel structure of claim 1 wherein the features of the first photovoltaic material have a diameter of 60 to 40 micrometres.

4. The panel structure of claim 1 wherein the features of the first photovoltaic material have a diameter of 40 to 20 micrometres.

5. The panel structure of claim 1 wherein the features of the first photovoltaic material have a diameter of 20 to 10 micrometres.

6. The panel of claim 1 wherein the diffractive element comprises a periodic or quasi-periodic arrangement of the first photovoltaic material.

7. The panel structure of claim 1 wherein the diffractive element comprises regularly shaped and repetitive features that determine a period of the diffractive element.

8. The panel structure of claim 1 wherein the diffractive element is a diffractive grating having a period of 150 micrometres or less.

9. The panel structure of claim 1 wherein the first photovoltaic material of at least a portion of the diffractive element forms a pattern that has features that are sufficiently small such that the pattern is at least largely invisible to the naked eye.

10. The panel structure of claim 1 wherein the diffractive element is arranged such that predominantly light having a wavelength in an infrared wavelength range is deflected towards the at least one edge surface.

11. The panel structure of claim 1 wherein the first photovoltaic material is provided in the form of a thin film material and comprises CIS (Copper Indium Diselenide) or CIGS (Copper Indium Gallium Diselenide).

12. The panel structure of claim 1 wherein the first photovoltaic material of the diffractive element forms a periodic or quasiperiodic arrangement that determines the period of the diffractive element.

13. The panel structure of claim 1 wherein the diffractive element comprises lines of the first photovoltaic material and transmissive materials between the lines of the first photovoltaic material.

14. The panel structure of claim 1 wherein the diffractive element comprises a pattern that is formed from the first photovoltaic material and transmissive materials that are at least largely transmissive for visible light and wherein the transmissive materials have a polygonal shape.

* * * * *